US007696741B2

(12) United States Patent
Gurr

(10) Patent No.: US 7,696,741 B2
(45) Date of Patent: Apr. 13, 2010

(54) SYSTEM AND METHOD FOR ADAPTIVELY DETERMINING THE TRANSITION RATE OF A QUANTIZED SIGNAL

(75) Inventor: Walter P. M. Gurr, Seattle, WA (US)

(73) Assignee: Korry Electronics, Co., Seattle, WA (US)

( * ) Notice: Subject to any disclaimer, the term of this patent is extended or adjusted under 35 U.S.C. 154(b) by 376 days.

(21) Appl. No.: 11/741,620

(22) Filed: Apr. 27, 2007

(65) Prior Publication Data

US 2008/0265865 A1 Oct. 30, 2008

(51) Int. Cl.
*G01R 23/06* (2006.01)

(52) U.S. Cl. ................. 324/76.39; 324/71.1; 324/76.69

(58) Field of Classification Search ............. 324/76.39, 324/76.69

See application file for complete search history.

(56) References Cited

U.S. PATENT DOCUMENTS

| | | | | |
|---|---|---|---|---|
| 4,054,861 | A | | 10/1977 | Markison |
| 4,061,988 | A | | 12/1977 | Lewandowski |
| 4,156,820 | A | | 5/1979 | Fukuda et al. |
| 4,203,093 | A | | 5/1980 | Edwards |
| 4,359,719 | A | | 11/1982 | Schwarzer |
| 4,489,303 | A | | 12/1984 | Martin |
| 4,673,827 | A | | 6/1987 | Sommer |
| 4,728,928 | A | | 3/1988 | Shipley |
| 4,791,257 | A | | 12/1988 | Frey et al. |
| 4,829,248 | A | | 5/1989 | Loubier |
| 5,029,304 | A | | 7/1991 | Tolmie, Jr. |
| 5,045,920 | A | | 9/1991 | Vig et al. |
| 5,192,877 | A | | 3/1993 | Bittebierre et al. |
| 5,300,769 | A | * | 4/1994 | Dahlin et al. .......... 250/227.23 |
| 5,457,458 | A | * | 10/1995 | Saxon ........................ 341/157 |
| 5,670,886 | A | | 9/1997 | Wolff et al. |
| 5,790,046 | A | | 8/1998 | Blossfeld |
| 5,861,796 | A | | 1/1999 | Benshoff |
| 6,097,272 | A | | 8/2000 | Grover et al. |
| 6,494,409 | B1 | | 12/2002 | Franke |
| 6,566,619 | B2 | | 5/2003 | Gillman et al. |
| 6,777,928 | B2 | | 8/2004 | Ramirez |

(Continued)

FOREIGN PATENT DOCUMENTS

DE 10229804 A1 * 3/2003

OTHER PUBLICATIONS

Texas Advanced Optoelectronic Solutions Inc., TCS230 Programmable Color Light-to-Frequency Converter Product Pamphlet, 2004, pp. 1-10.

*Primary Examiner*—Timothy J Dole
*Assistant Examiner*—John Zhu
(74) *Attorney, Agent, or Firm*—Seed IP Law Group PLLC

(57) ABSTRACT

An adaptive measurement system measures a transition rate associated with an output of a device. An input signal that is characteristic of the output of the device is received by an input signal-to-frequency converter, which changes state based upon a characteristic of the input signal. The input signal-to-frequency converter provides a second signal, which reflects the state changes of the input signal-to-frequency converter. The second signal is sampled over a sample period and an instance of average transition rate is determined. A control subsystem may use the instance of average transition rate for regulating the device.

24 Claims, 9 Drawing Sheets

U.S. PATENT DOCUMENTS 6,867,582 B2 3/2005 Muraji et al.
6,867,680 B1 3/2005 Kulle
6,940,275 B2 9/2005 Sogge
6,981,168 B2 * 12/2005 Schmatz et al. ............ 713/500
7,009,386 B2 3/2006 Tromblee et al.
7,088,096 B2 8/2006 Etherington et al.
7,154,305 B2 * 12/2006 Driediger et al. .............. 327/47
2002/0153993 A1 10/2002 Inada et al.

* cited by examiner

SYSTEM AND METHOD FOR ADAPTIVELY DETERMINING THE TRANSITION RATE OF A QUANTIZED SIGNAL

BACKGROUND

1. Technical Field

This disclosure is generally related to the systems and methods of regulating an output of a device, and more particularly, related to systems and methods of regulating an output of a device using a transition rate of a quantized signal, where the transition rate is proportional to an output of the device, for example an LED backlight.

2. Description of the Related Art

Control systems for regulating a device are well known. Typically, control systems regulate devices by employing a feedback loop. However, when the device has a wide dynamic response range, it may become difficult to rapidly and accurately regulate the device over the response range, especially at the extrema of the response range.

As a non-limiting example, the output of a multi-color LED (light emitting diode) backlight is regulated to provide color and luminance control. Currently, one type of control system for a multi-color LED backlight may include photo sensors with color filters, linear or log amplifiers, and analog to digital converters. This sort of control system has several disadvantages. One disadvantage, among others, is that multi-color LED backlights are frequently intended to be used in relatively small spaces, and such a control system takes up too much of the available space. Another disadvantage is cost and the number of components in such a control system. The more components in a control system, the higher the chance that at least one of the components will malfunction.

Some control systems for a multi-color LED backlight may include a single unfiltered photo sensor for luminance measurement and a "color correction mode" where each color of LED source is cycled through and measured individually. However, this type of control system may require periodic maintenance activity for color correction and does not provide feedback to correct for dynamic amplitude, temperature and supply variations.

Thus, there exists a need for a control system for regulating devices such as backlights and other devices such as rotary motors that have a wide range of dynamic response. It is desired that such a control system provide fast measurement of an output from the regulated device and transient control of the regulated device. It is further desired that such a control system can be made to dynamically track with the sample speed of data related to the output of the regulated device. In addition, it is desired that such a control system be economical and be fault tolerant to timing errors.

BRIEF SUMMARY

In one aspect, an adaptive measurement system for measuring a transition rate associated with an output of a device includes an input signal-to-frequency converter subsystem, an accumulator, a transition rate measurement subsystem, and a control subsystem. The input signal-to-frequency converter subsystem receives a first signal that is proportional to the output of the device and quantizes a characteristic of first signal. The input signal-to-frequency converter subsystem provides a second signal having multiple states and a transition rate that is proportional to a rate of quantization of the characteristic of the first signal. The accumulator receives the second signal and accumulates a state transition count that is representative of a number of transitions between the multiple states in the second signal over a first sample period. The transition rate measurement subsystem reads the accumulator at a time that is no earlier than the end of the first sample period to find state transition count and determines an instance of average transition rate for the second signal based at least upon the state transition count and the first sample period, and the control subsystem receives the instance of average transition rate for the second signal and provides the device with feedback control based at least upon the instance of average transition rate.

Another aspect provides a method of regulating an output of a device. The method includes: receiving a converted-input signal having multiple states and a transition rate that is proportional to a rate of quantization of a characteristic of an input signal, the input signal being proportional to the output of the device; accumulating a state transition count that is representative of a number of transitions between the multiple states in the converted-input signal over a first sample period; reading the accumulator at a time that is no earlier than the end of the first sample period to find state transition count; determining an instance of average transition rate for the converted-input signal based at least upon the state transition count and the first sample period; and providing the device with feedback control based at least upon the instance of average transition rate.

In yet another aspect, an adaptive system for measuring an output of a device includes: an input signal-to-frequency converter subsystem that receives a first signal that is proportional to the output of the device and quantizes a characteristic of the first signal, the input signal-to-frequency converter subsystem providing a second signal having multiple states and a transition rate that is proportional to a rate of quantization of the characteristic of the first signal; and a controller subsystem communicatively coupled to the input signal-to-frequency converter subsystem having a bit accumulator that receives the second signal and that accumulates a state transition count that is representative of a number of transitions between the multiple states in the second signal over a first sample period, the controller subsystem being configured to implement a logic for determining an instance of average transition rate for the second signal based at least upon the state transition count.

DETAILED DESCRIPTION

Figure 1:
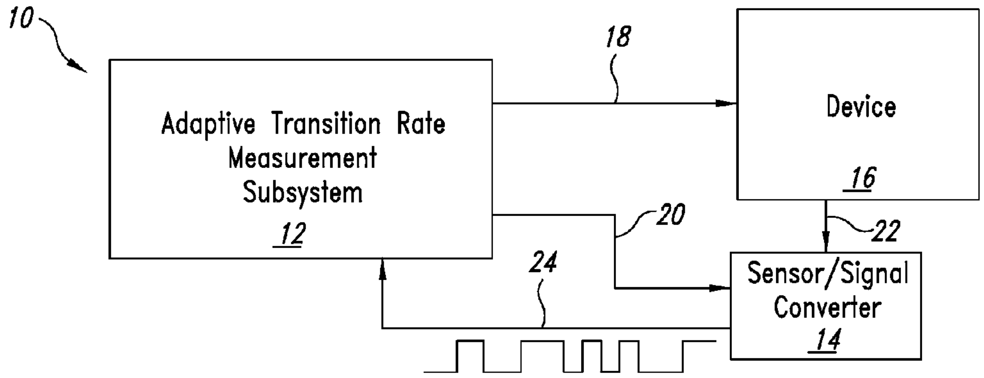
FIG. 1 is a block diagram of a Device Output Measurement System according to one illustrated embodiment.

In the drawings, identical reference numbers identify similar elements or acts. The sizes and relative positions of elements in the drawings are not necessarily drawn to scale. For example, the shapes of various elements and angles are not drawn to scale, and some of these elements are arbitrarily enlarged and positioned to improve drawing legibility. Further, the particular shapes of the elements as drawn, are not intended to convey any information regarding the actual shape of the particular elements, and have been solely selected for ease of recognition in the drawings.

In the following description, certain specific details are set forth in order to provide a thorough understanding of various disclosed embodiments. However, one skilled in the relevant art will recognize that embodiments may be practiced without one or more of these specific details, or with other methods, components, materials, etc. In other instances, well-known structures associated with sensors, devices and the like have not been shown or described in detail to avoid unnecessarily obscuring descriptions of the embodiments.

Unless the context requires otherwise, throughout the specification and claims which follow, the word "comprise" and variations thereof, such as "comprises" and "comprising" are to be construed in an open, inclusive sense, that is as "including, but not limited to."

Reference throughout this specification to "one embodiment" or "an embodiment" means that a particular feature, structure or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

As used in this specification and the appended claims, the singular forms "a," "an," and "the" include plural referents unless the content clearly dictates otherwise. It should also be noted that the terms "and" and "or" are generally employed in the sense including "and/or" unless the content clearly dictates otherwise.

The headings and Abstract of the Disclosure provided herein are for convenience only and do not interpret the scope or meaning of the embodiments.

FIG. 1 shows a Device Output Measurement System (DOMS) 10 according to one illustrated embodiment. The DOMS 10 includes an Adaptive Transition Rate Measurement Subsystem (ATRMS) 12 that is communicatively coupled to a Sensor/Signal Converter 14.

Optionally, the ATRMS 12 may be coupled to a device 16 and, if so, may provide the device 16 with device operation parameters 18 and/or drive the device 16. In addition, the ATRMS 12 may provide the Sensor/Signal Converter 14 with data processing parameters 20.

In the embodiment illustrated, the device 16 receives the device operation parameters 18 and operates in accordance with the device operation parameters 18. Operation of the device 16 results in a device output 22, which is detected or received by the Sensor/Signal Converter 14.

The Sensor/Signal Converter 14 receives the data processing parameters 20 and uses the data processing parameters 20 to process the device output 22. The Sensor/Signal Converter 14 provides the ATRMS 12 with an output, which is referred to herein as a converted-input signal 24. For the sake of clarity, the converted-input signal 24 is described as a pulse waveform signal, but such description is nonlimiting.

The transition rate between high and low states of the converted-input signal 24 is related to a quantized characteristic of the device output 22. In some embodiments, the Sensor/Signal Converter 14 may operate independently of the ATRMS 12. In that case, it may be unnecessary for the ATRMS 12 to provide the Sensor/Signal Converter 14 with the data processing parameters 20. Similarly, the device 16 may operate independently of the ATRMS 12, and in that case, it may unnecessary for the ATRMS 12 to provide the device 16 with the device operation parameters 18.

Exemplary embodiments of the DOMS 10 are described below in terms of the device output 22 from the device 16 being light or an electrical signal. However, such descriptions are provided merely for the sake of clarity and are nonlimiting. The principles disclosed herein may be applied to devices beyond light emitting devices and devices that provide an electrical signal. As shown below, whether the device output 22 is detected or received depends upon the nature of the device 16 and the nature of the Sensor/Signal Converter 14.

Figure 2A:
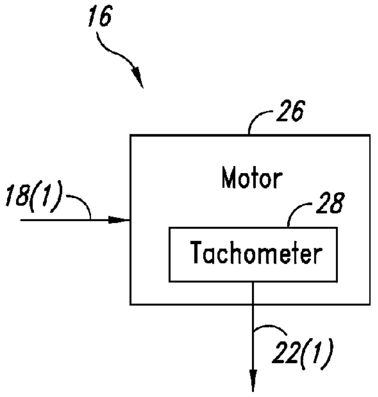
FIG. 2A is a block diagram of a first device that provides an output signal according to one illustrated embodiment.

In FIG. 2A, the various labels having both a reference numeral and "(1)" appended thereto identify components and/or features that are similar in at least some respects as those shown in FIG. 1 that are labeled with the same reference numeral. The detailed description of such components and/or features are initially provided with respect to FIG. 1 and, for the sake of brevity, the description of such components in the context of their subsequent "(1)" labeled counterparts in FIG. 2A may be abbreviated or omitted.

FIG. 2A shows an embodiment of the device 16 according to one illustrated embodiment. The device 16 includes a rotary motor 26 and a tachometer 28. The rotary motor 26 operates in accordance with device operation parameters 18. The tachometer 28 measures revolutions per minute (RPMs) of the rotary motor 26 and the produces the device output 22(1) based upon the revolutions per minute. In this embodiment, the device output 22(1) is an electrical signal that is received by the Sensor/Signal Converter 14.

Figure 2B:
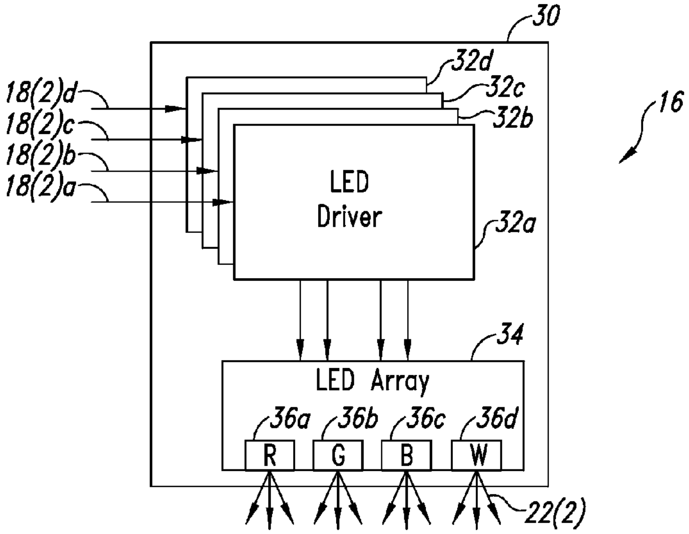
FIG. 2B is a block diagram of a second device that emits an output according to one illustrated embodiment.

In FIG. 2B, the various labels having both a reference numeral and "(2)" appended thereto identify components and/or features that are similar in at least some respects as those shown in FIG. 1 that are labeled with the same reference numeral. The detailed description of such components and/or features are initially provided with respect to FIG. 1 and, for the sake of brevity, the description of such components in the context of their subsequent "(2)" labeled counterparts in FIG. 2B may be abbreviated or omitted.

FIG. 2B shows another embodiment of the device 16 according to one illustrated embodiment. The device 16 may be a controllable light source 30 that emits light as the device output 22. In one non-limiting embodiment, the controllable light source 30 may be a multi-color LED backlight.

In the embodiment illustrated, the light source 30 includes LED drivers, individually referenced as 32*a*-32*d* and collectively referenced as 32, and a LED array 34 that is communicatively coupled to the LED drivers 32. The LED array 34 includes multiple LEDs, collectively referenced as 36, one or more red LEDs 36*a*, one or more green LEDs 36*b*, one or more blue LEDs 36*c*, and one or more white LEDs 36*d*, wherein the color (red, green, blue, white) for each LED refers to the color of light emitted by the respective LED. The LED driver 32*a* receives device operation parameters 18(2)*a* and drives the red LEDs 36*a* accordingly; the LED driver 32*b* receives device operation parameters 18(2)*b* and drives the green LEDs 36*b* accordingly; and so on. Device operation parameters 18(2)*a*-18(2)*d* may include a PWM signal and/or an output amplitude/magnitude indicator (eg., a current and/or voltage). The output amplitude/magnitude indicator may be used by the light source 30 to control the amount/intensity of the light 22(2) emitted therefrom. For example, the LED drivers 32 may use an output amplitude/magnitude indicator for controlling current through the LEDs 36 and thereby the amount of light 22(2) emitted from the LEDs 36.

In some embodiments, the LED array 34 may be configured to have similar LEDs 36 such that the light 22(2) is monochromatic and/or substantially monochromatic. The light 22(20 may be in the portion of the electromagnetic spectrum that is visible to humans, or may be in other portions of the electromagnetic spectrum, for example, the near-infrared portion and/or the near ultraviolet portion.

In some embodiments, the light source 30 may not include an LED driver and the LED array 34 may be configured to be driven by the output amplitude/magnitude indicator.

In some embodiments, a single LED driver may drive the LED array 34, and the LED array 34 may, or may not, include LEDs 36 that emit different colored light. The single LED driver 32 may drive the LEDs 36 in the LED array 34 collectively, e.g., with the same current and duty cycle.

In some embodiments, the multiple LED drivers 32 may be replaced by a single multi-color LED driver 32. The multi-color LED driver 32 may be configured to drive individually selected sets of LEDs 36. For example, the multi-color LED driver 32 may drive red LEDs 36*a* at a different current than blue LEDs 36*c*.

Figure 3A:
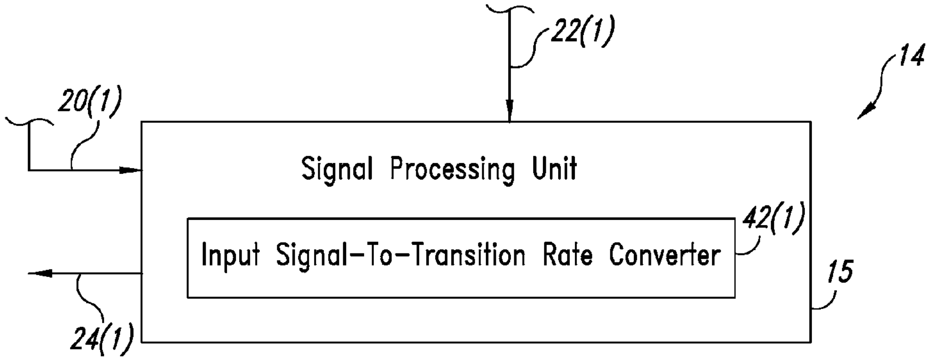
FIG. 3A is a block diagram of a signal processing unit that receives the output signal of the device of FIG. 2A according to one illustrated embodiment.

In FIG. 3A, the various labels having both a reference numeral and "(1)" appended thereto identify components and/or features that are similar in at least some respects as those shown in FIG. 1 that are labeled with the same reference numeral. The detailed description of such components and/or features are initially provided with respect to FIG. 1 and, for the sake of brevity, the description of such components in the context of their subsequent "(1)" labeled counterparts in FIG. 3A may be abbreviated or omitted.

FIG. 3A shows an embodiment of the Sensor/Signal Converter 14 according to one illustrated embodiment. The Sensor/Signal Converter 14 includes a signal processing unit 15 that is communicatively coupled to the device 16 such as the rotary motor 26. The signal processing unit 15 receives the device output 22(1) from the tachometer 28. The signal processing unit 15 includes an Input Signal-to-Frequency Converter (ISFC) subsystem 42(1). The signal processing unit 15 is communicatively coupled to the ATRMS 12 and provides the ATRMS 12 with the converted-input signal 24(1).

In this embodiment, the ISFC subsystem 42(1) receives the device output 22(1), which is variable and which is proportional to the RPMs of the motor 26, as an input. The ISFC subsystem 42(1) processes the input (i.e., device output 22(1)) to produce the converted-input signal 24(1). The ISFC subsystem 42(1) may process the input (i.e., device output 22(1)) in accordance with received data processing parameters 20(1). Among other things, the data processing parameters 20(1) may include parameters for applying signal filtering operations. The transition rate of the converted-input signal 24(1) may be proportional to one or more electrical characteristics such as, but not limited to, current, voltage, transition rate, etc. of the input (i.e., device output 22(1)).

Figure 3B:
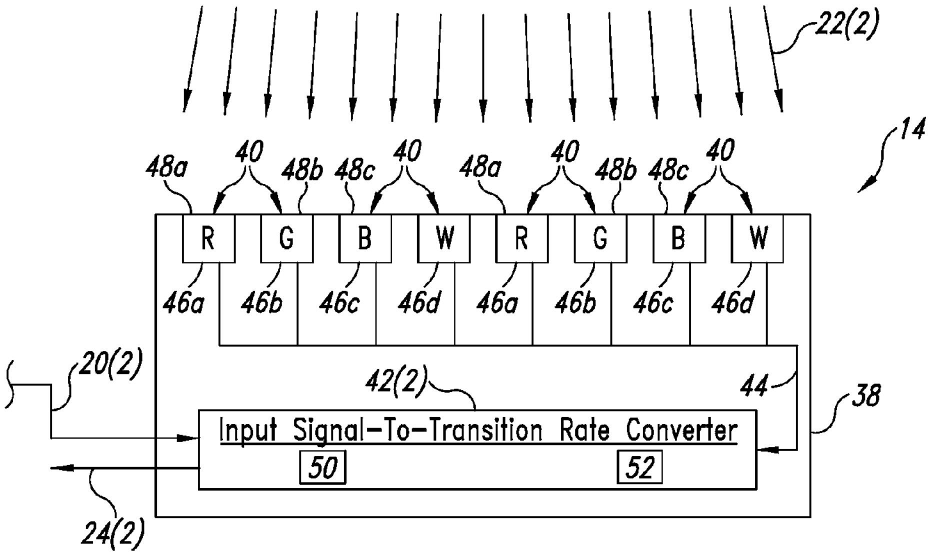
FIG. 3B is a block diagram of a light processing unit that detects the output emitted from the device of FIG. 2B according to one illustrated embodiment.

In FIG. 3B, the various labels having both a reference numeral and "(2)" appended thereto identify components and/or features that are similar in at least some respects as those shown in FIG. 1 and FIG. 3A that are labeled with the same reference numeral. The detailed description of such components and/or features are initially provided with respect to FIG. 1 and FIG. 3A and, for the sake of brevity, the description of such components in the context of their subsequent "(2)" labeled counterparts in FIG. 3B may be abbreviated or omitted.

FIG. 3B shows an embodiment of the Sensor/Signal Converter 14 according to another illustrated embodiment. The Sensor/Signal Converter 14 is shown as a light processing unit 38 having multiple light sensors 40 for detecting the light 22(2) and an Input Signal-to-Frequency Converter (ISFC) subsystem 42(2), which is in communication with the light sensors 40 and the ATRMS 12.

Each light sensor 40 detects light 22(2) that is incident upon the respective light sensor 40 and produces a signal 44 that has a characteristic that is proportional to a characteristic of the detected light. For example, a characteristic of the detected light 22(2) is "intensity" and a characteristic of the signal 44 is electrical current. As is well known, many light sensors produce a signal having a current that is proportional to the intensity of detected light. Thus, the characteristic of the signal 44 may be electrical current and the corresponding characteristic of the detected light 22(2) may be intensity. The scope of the embodiments described herein are not limited to the aforementioned characteristics.

The light sensors 40 provide the ISFC subsystem 42(2) with the signals 44, herein after referred to as input signals 44. The ISFC subsystem 42(2) processes the input signals 44 to produce the converted-input signal 24(2). The ISFC subsystem 42(2) may process the input signals 44 using data processing parameters 20(2).

The ISFC subsystem 42(2) includes an input-signal quantizer 50 and a memory 52 storing an input-signal quanta threshold value ($I_{TH}$). The input-signal quantizer 50 accumulates or counts an "input-signal quanta" value that is proportional to one or more electrical characteristics such as, but not limited to, current, voltage, frequency, etc. of the input signals 44. Thus, assuming for example that the input-signal quantizer 50 measures the current in the input signals 44 and that over a first time period (T) the measured current is i, the rate at which the input-signal quanta value increases is $\alpha i/T$, and that over a second time period of equal duration (T) the measured current is 2i, then during the second time period the rate at which the input-signal quanta value increases is $2\alpha i/T$. When the value of the input-signal quanta reaches the value of the input-signal quanta threshold value ($I_{TH}$), then the ISFC subsystem 42(2) changes state and the value of the input-signal quantizer 50 is reset to zero. The ISFC subsystem 42(2) toggles between high and low states each time the value of the input-signal quanta reaches the value of the input-signal quanta threshold value ($I_{TH}$). The converted-input signal 24 toggles between high and low states to correspond the ISFC subsystem 42(2) toggling between high and low states.

A nonlimiting example of a light processing unit 38 is a programmable color light-to-frequency converter model TCS230 by Texas Advance Optical Solutions®, Inc. (TAOS, Inc.). The light-to-frequency converter TCS230 produces a pulse waveform signal that has a transition rate proportional to the intensity of light detected by the light-to-frequency converter TCS230. The light-to-frequency converter TCS230 has a very fast response time that can accurately measure average light intensity of a 160 Hz PWM backlight across a very wide dynamic range. By counting the number of state transitions in a 160 Hz period, the average pulse frequency and the average luminance seen by the human eye can be determined.

A single light sensor 40 may be comprised of one photodiode 46*a* or 46*b* or 46*c* or 46*d* and optionally one filter 48*a* or 48*b* or 48*c*. Light sensors 40 having a photodiode 46*a* and a filter 48*a* detect red light; light sensors 40 having a photodiode 46*b* and a filter 48*b* detect green light; and light sensors 40 having a photodiode 46*c* and a filter 48*c* detect blue light. The light sensors 40 having a photodiode 46*d* and no filter detect white light.

The ISFC subsystem 42(2) receives data processing parameters 20(2) from the ATRMS 12. Based at least upon the data processing parameters 20(2), the ISFC subsystem 42(2) may determine which input signals 44 to process (and may ignore the non-selected input signals 44), or may use input signals 44 from all of the light sensors 40, to accumulate the input-signal quanta, and thereby produce the converted-input signal 24(2). The selected input signals 44 may be based upon one or more colors of detected light such as red light, green light, etc.

Figure 4:
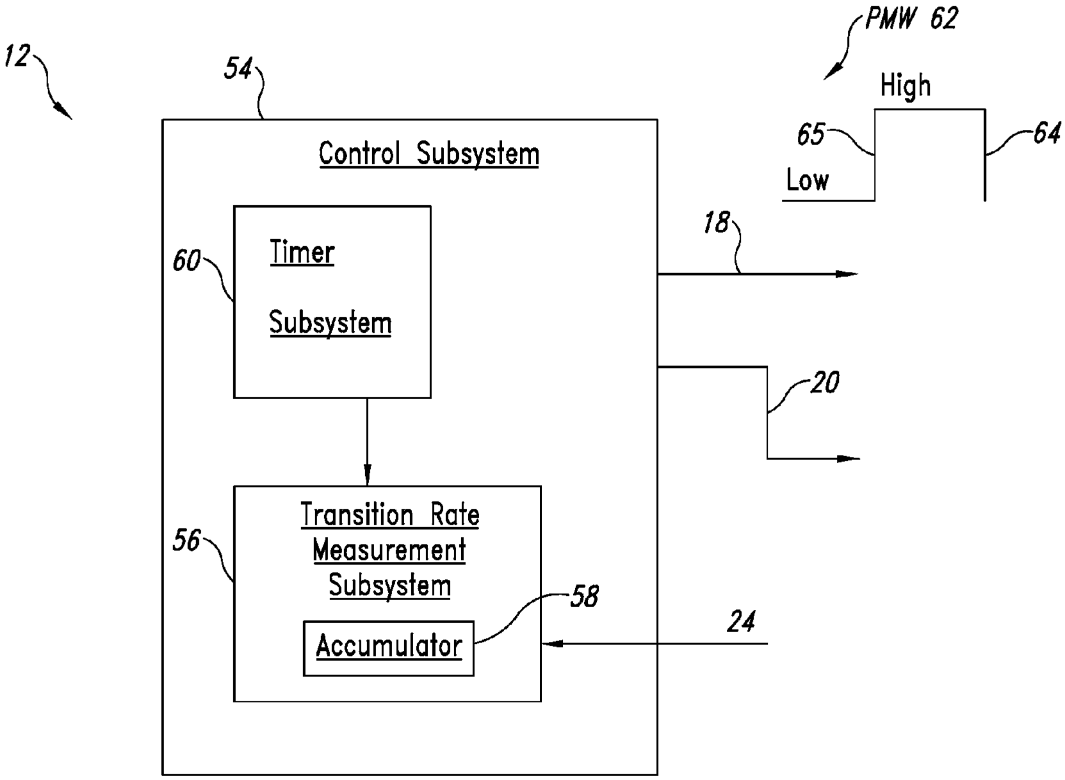
FIG. 4 is a block diagram of an Adaptive Transition Rate Measurement Subsystem according to one illustrated embodiment.

FIG. 4 shows the ATRMS 12 according to one illustrated embodiment. The ATRMS 12 includes a control subsystem 54 having a timer subsystem 60 and a transition rate measurement subsystem 56. The transition rate measurement subsystem 56 includes an accumulator 58. In some embodiments, the control subsystem 54 may include a processor and logic for, among other things, implementing the timer subsystem 60 and/or the transition rate measurement subsystem 56. In some embodiments, the logic may be stored in a memory and/or implemented in firmware and/or hardware. There are two techniques commonly used for measuring frequency of a train of pulses in a microprocessor. These include:

1) Using a timer and an input capture port to measure time between pulses. The highest frequency is limited by the frequency of the timer and the lowest by the size of the timer register; and
2) Using an accumulator port to count the number of pulses in a fixed time period. The highest frequency is limited by the size of the accumulator register and the lowest by the fixed time period.

Of the two approaches the second (accumulator) technique is preferred as the sampling period can be synchronized with the source modulation period. Synchronizing the two frequencies avoids beat frequencies which would require a low pass filter and result in a delayed measurement time and slow transient response for control systems.

The accumulator 58 receives the converted-input signal 24 from the Sensor/Signal Converter 14 and counts the number of transitions between states for a given sample period. At the end of the sample period the transition rate measurement subsystem 56 reads the value of the accumulator 58 and afterwards resets the accumulator 58. In one embodiment, the accumulator 58 may be a bit accumulator, such as a 16-bit accumulator having a dynamic range of for example, $2^{16}$ (65,536).

The transition rate measurement subsystem 56 determines an instance of average transition rate for the converted-input signal 24 based upon at least the value of the accumulator 58 and based at least upon the effective time span of the sample period. The instance of average transition rate is provided to the control subsystem 54.

The timer subsystem 60 may generate a train of cycles of a pulse-width modulation (PWM) signal 62 that may be used to synchronize components of the DOMS 10. For example, the device 16 and the accumulator 58 may be synchronized on a trailing edge 64 of a cycle of the PWM signal 62. In other embodiments, the device 16 on a rising edge 65 of a cycle of the PWM signal 62.

Among other things, the control subsystem 54 determines the device operation parameters 18 and the data processing parameters 20. In addition, the control subsystem 54 may, among other things, also determine a sample period, i.e., a length of time over which the converted-input signal 24 is sampled or averaged, based at least upon the value of the accumulator 58 at various times. The control subsystem 54 may also set the duration or period of a cycle of the PWM signal 62 and/or the duty cycle of the PWM signal 62.

The control subsystem 54 allows for discrete control calculations (or feedback) after each successful accumulator sample. Furthermore if there is a large transient then transient response time in the converted-input signal, then response time is more important then accuracy. In this case, the control subsystem 54 may relax error limits giving faster measurements and faster transient response.

Similarly if the control system is in steady state then response time is less important than accuracy. In this case error limits can be dynamically tightened giving slower measurements and reduced quantization error.

In one embodiment, the light source 30 is a multicolor backlight for an Active Matrix LCD display. White color perceived to be seen on the display can vary across temperature due to a number of different temperature sensitive components in the system.

Sensitivity change of the light processing subsystem 38 across temperature.

Wavelength shift of the LED light sources across temperature producing an attendant sensitivity change in the light processing subsystem 38.

Spectral transmissivity change of the optics stack and AMLCD across temperature.

However, the LED wavelength shift tends to be dominant factor in the color shift. But even without knowing the exact source of the color shift a system wide correction can be applied by scaling red, green and blue readings from the light processing subsystem 38 based on LED temperature.

The control subsystem 54 may be configured to provide this temperature compensation function, which can be derived by driving the display to a constant color and luminance across a range of temperatures and then measuring the reported values of red, green and blue luminance from the light processing subsystem 38. The compensation function is then given by normalizing the ratio of these three values at each drive level and then inverting.

The control subsystem 54 may include a look up table with linear interpolation based on measured LED temperature. The best temperature to measure may be the LED temperature as this has the most significant effect on measured color.

Color perceived to be seen on the display can also vary across PWM amplitude due to two different amplitude sensitive components.

Non-linear response of the photo sensor across PWM amplitude.

Wavelength shift of the LED light sources across PWM amplitude producing an attendant sensitivity change in the photo sensor.

Without knowing the exact source of the color shift a system wide correction can be applied by scaling the red, green and blue readings from the photo sensor based on PWM amplitude.

This PWM amplitude compensation function can be derived by driving the display across a range of PWM amplitudes and then measuring the reported values of red, green and blue luminance from the photo sensor. The compensation function is then given by normalizing the ratio of these three values at each drive level and then inverting.

In software this compensation is most easily applied by using a look up table with linear interpolation based on PWM amplitude. The best temperature to measure is the LED temperature as this has the most significant effect on measured color.

The system color sensitivity to PWM duty cycle is not large enough to justify compensation.

Compensation of Luminance over AMLCD Temperature

The luminance has a similar temperature shift however an absolute shift in luminance is less visible to human perception. However one gross source of luminance change which should be compensated for is loss of transmission through the AMLCD at elevated temperature. This loss of transmission can be on the order of 20%-30% at elevated operating temperature which may not be acceptable for high end applications.

The compensation function can be derived in the same manner by driving the display to a constant color and luminance across a range of temperatures and then measuring the reported value of white (no color filter) luminance from the photo sensor. The compensation function is then given by normalizing and inverting the measured luminance values.

The control subsystem 54 may include a second look up table based on measured temperature and linear interpolation. However in this case the most important temperature to consider may be temperature of the AMLCD, not the temperature of the LED's.

In one mode of operation, the sample period and the PWM signal 62 are synchronized. The control subsystem 54 sets the transition rate of the PWM signal 62. The timer subsystem 60 generates the PWM signal 62, and in various embodiments, the trailing edge 64 of the PWM signal 62 may be used as an interrupt signal. In other embodiments, the timer subsystem 60 may generate a start signal and an interrupt signal. The various components of the DOMS 10 may use the start signal and the interrupt signal for synchronization.

FIGS. 5A-5E show timing diagrams for the output of the timer subsystem 60 (PWM signal 62), the output of the light source 30 (light 22(2)), the value of the input-signal quantizer 50, the output of the ISFC subsystem 42(2) (converted-input signal 24), and the value in the accumulator 58, respectively. The FIGS. 5A-5E represent ideal timing diagrams, i.e., there are no timing lags due to processing and/or transmission. In operation, there may be actual timing lags, but the timing diagrams 5A-5E represent and clearly explain the timing principles of the DOMS 10.

Figures 5A, 5B, 5C, 5D, 5E:
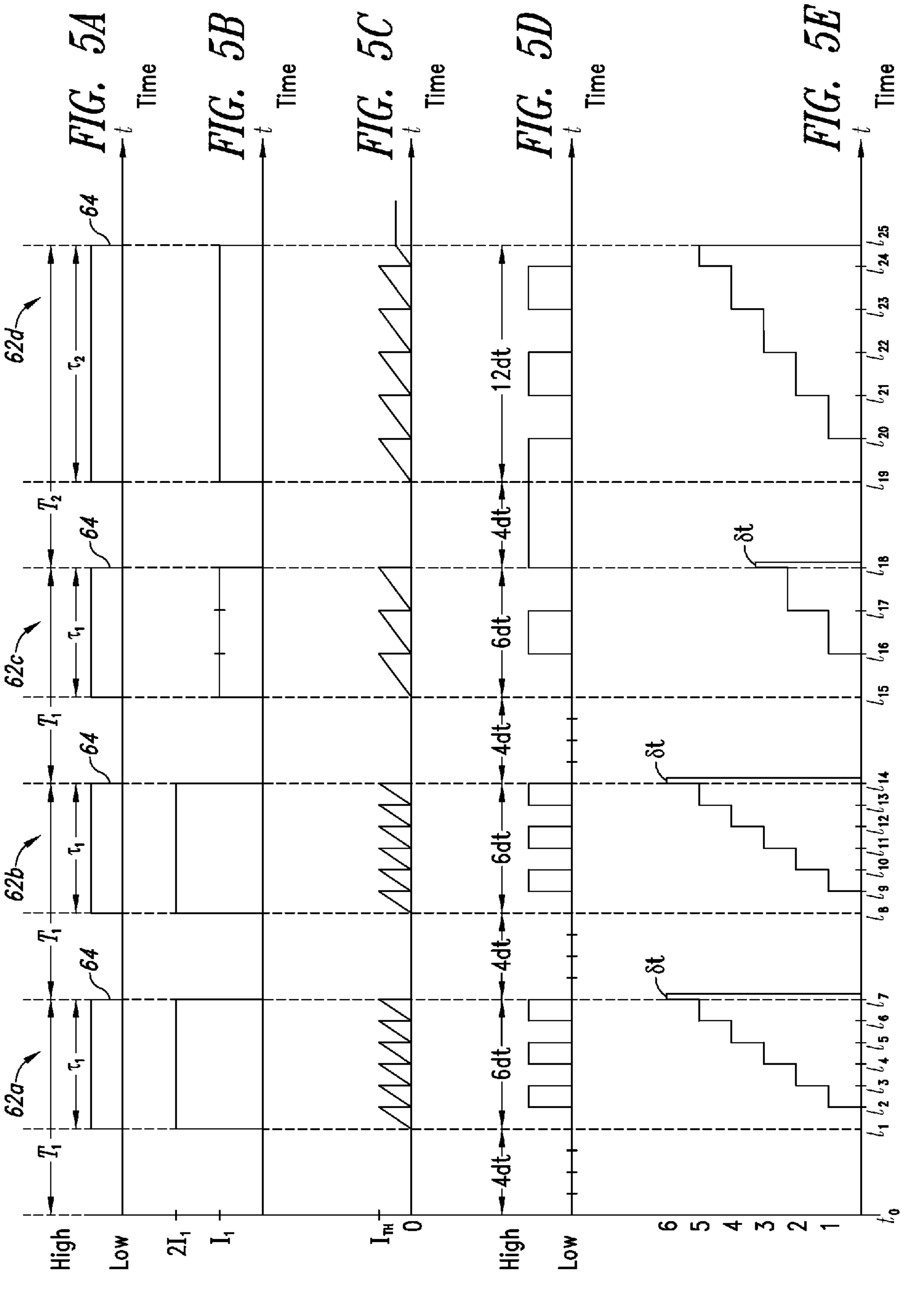
FIGS. 5A-5E are exemplary first timing diagrams for various components of the Device Output Measurement System.
Figure 6A:
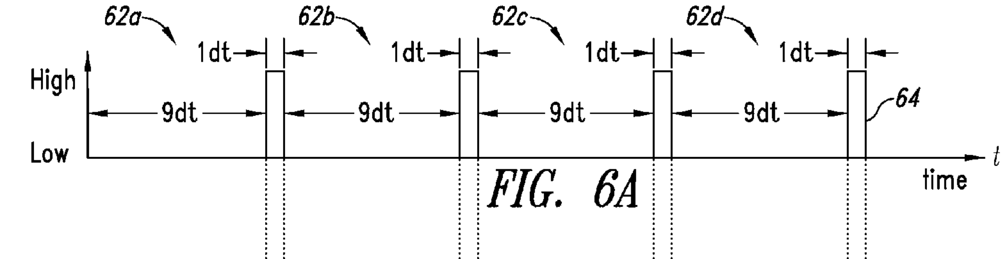
FIGS. 6A-6E are exemplary second timing diagrams for various components of the Device Output Measurement System.
Figure 6B:
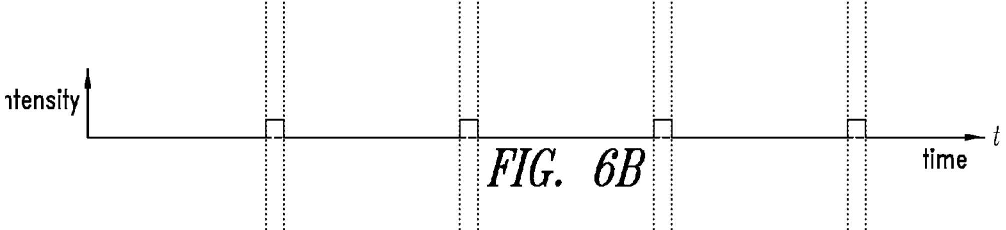
Figure 6C:
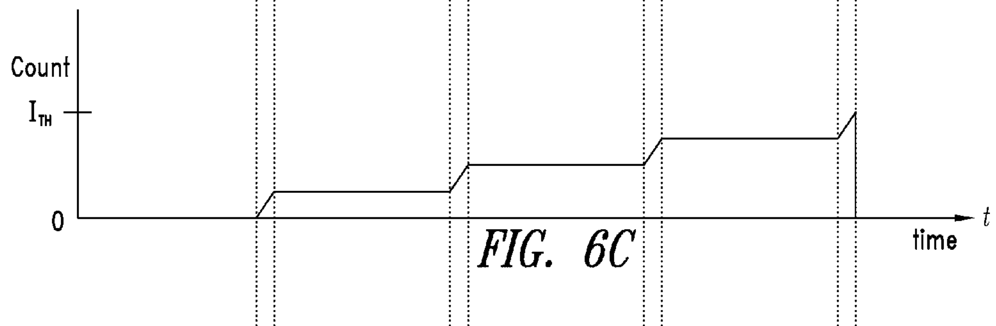
Figure 6D:
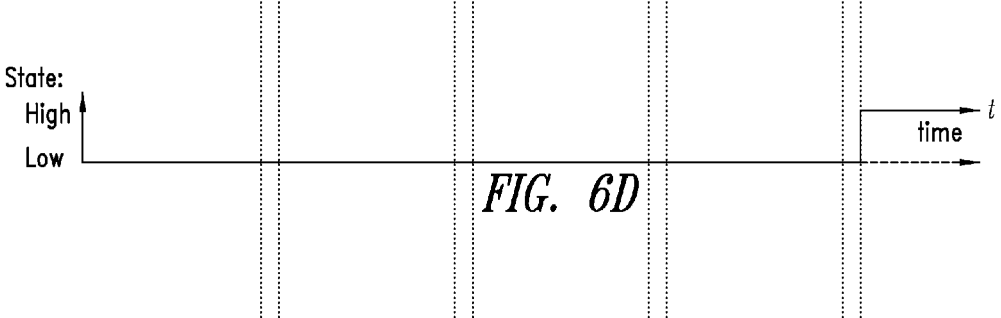
Figure 6E:
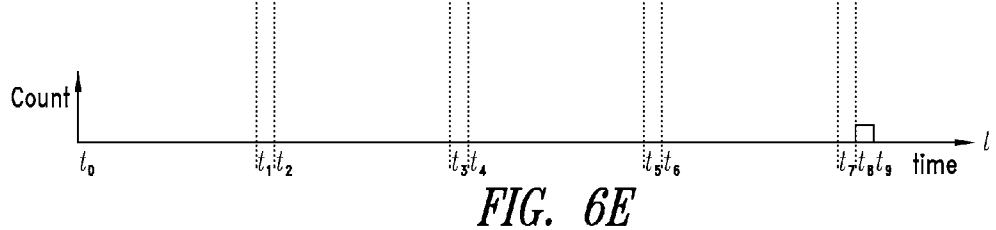

In FIG. 5A, a PWM signal 62 produced by the timer subsystem 60 is shown as a sequence of cycles 62*a*-62*d*. The cycles 62*a*-62*c* have a duration of $T_1$ (10 dt) and a duty cycle, $D_1=\tau_1/T_1=6/10$, where $\tau_1$ is the duration of the high state ($\tau_1=6$ dt). The cycle 62*d* has a duration of $T_2$ (16 dt) and a duty cycle $D_2==\tau_2/T_2=3/4$, where $T_2$ is the duration of the high state ($T_2=12$ dt). In this example, the light source 30, the ISFC subsystem 42, the frequency measurement subsystem 56 and the accumulator 58 are synchronized by the trailing edge 64 of each of the PWM signals 62*a*-62*d*. At time to, the cycle 62*a* begins; the light source 30 is off; the value of the input-signal quantizer 50 is zero; the ISFC subsystem 42 is in the low state; and the value of the accumulator 58 is zero.

At time $t_1$, the cycle 62*a* switches to the high state, and the light source 30 turns on and produces light 22(2) having an intensity of $2I_1$. In this example, the intensity of the light 22(2) is proportional to a device output parameter 18 such as an output amplitude/magnitude indicator. At time $t_1$, the input-signal quantizer 50 of the ISFC subsystem 42(2) begins to accumulate/count the quanta of the input-signal. The rate at which the input-signal quanta is accumulated by the input-signal quantizer 50 is proportional to the input signal 44. In the light processing unit 38, the input signal 44 is proportional to the intensity of the detected light 22(2).

In this example, the input-signal quantizer 50 reaches the input-signal quanta threshold value ($I_{TH}$) in a time span of dt when the light 22(2) has an intensity of $2I_1$. At time $t_2$, the ISFC subsystem 42(2) changes the state of the converted-input signal 24 to high and resets the input-signal quantizer 50 to zero. During the high state of the cycle 62*a*, the input-signal quantizer 50 reaches the input-signal quanta threshold value ($I_{TH}$) every dt, and in response thereto, the ISFC subsystem 42(2) toggles between high and low states every dt.

At time $t_7$, the cycle 62*a* ends, and the trailing edge 64 interrupts the light source 30, thereby turning the light source 30 off. Also at time $t_7$, the input-signal quantizer 50 reaches the input-signal quanta threshold value ($I_{TH}$) and resets to zero; and the ISFC subsystem 42(2) responds by switching from high to low state. It should be emphasized that the ISFC subsystem 42 switches state at time $t_7$ because the value of the input-signal quantizer 50 has reached the input-signal quanta threshold value ($I_{TH}$) and not due to the end of the cycle 62*a*.

Also at time $t_7$, the accumulator 58 counts another transition in the converted-input signal 24. In some embodiments, the trailing edge 64 signals an interrupt that causes the transition rate measurement subsystem 56 to read the accumulator 58. In other embodiments, the trailing edge 64 signals an interrupt that causes the accumulator 58 to provide the current value of the accumulator to the transition rate measurement subsystem 56. The trailing edge 64 also signals the resetting of the accumulator 58 to zero. In this example, the accumulator 58 is reset at time of $t_7+\delta t$. This is done to illustrate that the transition at time $t_7$ in the converted-input signal 24 is counted and that the transition rate measurement subsystem 56 knows the value of the accumulator 58 before the accumulator 58 is reset.

During the second cycle 62*b*, the operating conditions of the light source 30 and light processing unit 38 are the same as during the first cycle 62*a*, e.g., the device operation parameters 18 are unchanged, as are the data processing parameters 20. In addition, the first and the second cycles 62*a* and 62*b* have the same duration ($T_1$) and the same duty cycle ($D_1$). Thus, various portions of the timing diagrams during the second cycle 62*b* are identical to the similar portions of the timing diagram for first cycle 62*a*.

However during the third cycle 62*c*, the intensity of the light 22(2) from the light source 30 is $I_1$. This may occur because the light source 30 may be operating in accordance with new device operation parameters 18. Due to the 50% reduction in the intensity of the light 22(2), the input signals 44 are similarly reduced. The reduction in the input signals 44 to the ISFC subsystem 42(2) results in an increase in the time necessary for the input-signal quantizer 50 to reach the input-signal quanta threshold value ($I_{TH}$). In particular, the input-signal quantizer 50 now takes a time of 2 dt to reach the input-signal quanta threshold value ($I_{TH}$). During the high state of the third cycle 62*c*, the ISFC subsystem 42(2) toggles between high and low states every 2 dt. In particular, the converted-input signal 24 starts at a low state at $t_{15}$, the beginning of the high state of the third cycle 62*c*, and switches to the high state at time $t_{18}$, which is the time of the trailing edge 64 of the third cycle 62*c*.

The fourth cycle 62*d* has a longer duration ($T_2$=16 dt) and a different duty cycle ($D_2=\tau_2/T_2 \neq D_1$) than the duty cycles ($D_1$) of the first, the second, and the third cycles 62*a*-62*c*. The control subsystem 54 may adaptively change, among other things, the characteristics (e.g., duration and/or duty cycle) of PWM signal 62 based at least upon an instance of average transition rate and/or upon multiple instances of average transition rate such as averaging several instances of average transition rate together.

At time $t_{18}$, the state of the ISFC subsystem 42(2) is switched to the high state, and the value of the input-signal quantizer 50 is reset to zero. The ISFC subsystem 42(2) remains in the high state until the value of the input-signal quantizer 50 reaches the input-signal quanta threshold value ($I_{TH}$) at time $t_{20}$. The light source 30 is turned on at time $t_{19}$ and at time $t_{20}$, which is 2dt later, the value of the input-signal quantizer 50 reaches the input-signal quanta threshold value ($I_{TH}$). Thus, at time $t_{20}$, the input-signal quantizer 50 is reset to zero, and the state of the ISFC subsystem 42(2) changes. During the high state of the fourth cycle 62*d*, the ISFC subsystem 42(2) toggles between high and low states every 2dt.

At time $t_{25}$ when the fourth cycle 62*d* ends, the value of the input-signal quantizer 50 is $\frac{1}{2}I_{TH}$. The input-signal quantizer 50 is not reset at the trailing edge 64 of the fourth cycle 62*d*. Instead, the current value of the input-signal quantizer 50 remains constant until at least one of the input signals 44 to the ISFC subsystem 42(2) are non-zero.

FIGS. 6A-6E show timing diagrams for the output (PWM signal 62) of the timer subsystem 60, the output (light 22(2)) of the light source 30, the value in the input-signal quantizer 50, the output (converted-input signal 24) of the ISFC subsystem 42(2) and the value of the accumulator 58 over four PWM signals 62, each PWM signal 62A having a duration of 10dt and a duty cycle of 1/10.

At time $t_0$, the value of the input-signal quantizer 50 and the value of the accumulator 58 are zero; the state of the PWM signal is low as is the state of the converted-input signal 24; and the light source 30 is turned off. At time $t_1$, the light source 30 is turned on by the high state of the first cycle 62*a*, and the input-signal quantizer 50 begins to accumulate the input-signal quanta. The intensity of the light 22(2) is not sufficient for the value of the input-signal quantizer 50 to reach the input-signal quanta threshold value ($I_{TH}$) during the time span of $t_1$ to $t_2$, i.e., during the first cycle 62*a*. The value of the input-signal quantizer 50 is $\frac{1}{4}I_{TH}$ at time $t_2$.

The value of the input-signal quanta increases during the time spans ($t_3$,$t_4$), ($t_5$,$t_6$), ($t_7$,$t_8$), when at least one of the input signals 44 is non-zero, which corresponds to the time spans during which the intensity of the light 22(2) is non-zero. At time $t_8$, the value of the input-signal quanta reaches the input-signal quanta threshold ($I_{TH}$) and the state of the converted-input signal 24 switches to high. Also at time $t_8$, the value of the accumulator 58 is incremented.

In this example, the transition rate measurement subsystem 56 averages values of the accumulator over multiple pulses of the PWM signal 62. The transition rate measurement subsystem 56 reads the value of the accumulator 58 at times $t_2$, $t_4$, $t_6$, and $t_8$. At time $t_8$, the value of the accumulator 58 is 1 and is zero at the other times. At time $t_8$, the transition rate measurement subsystem 56 reads the accumulator 58 and determines that the value of the accumulator 58 is 1. During the time span of $t_8$ to $t_9$, the transition rate measurement subsystem 56 determines that the value of the accumulator 58 is sufficient for determining an instance of average transition rate. The transition rate measurement subsystem 56 calculates the instance of average transition rate using the sample time $t_8$-$t_0$ and the count of the accumulator 58 over the same time period, and resets the accumulator 58 at time $t_9$ to zero.

Figure 7:
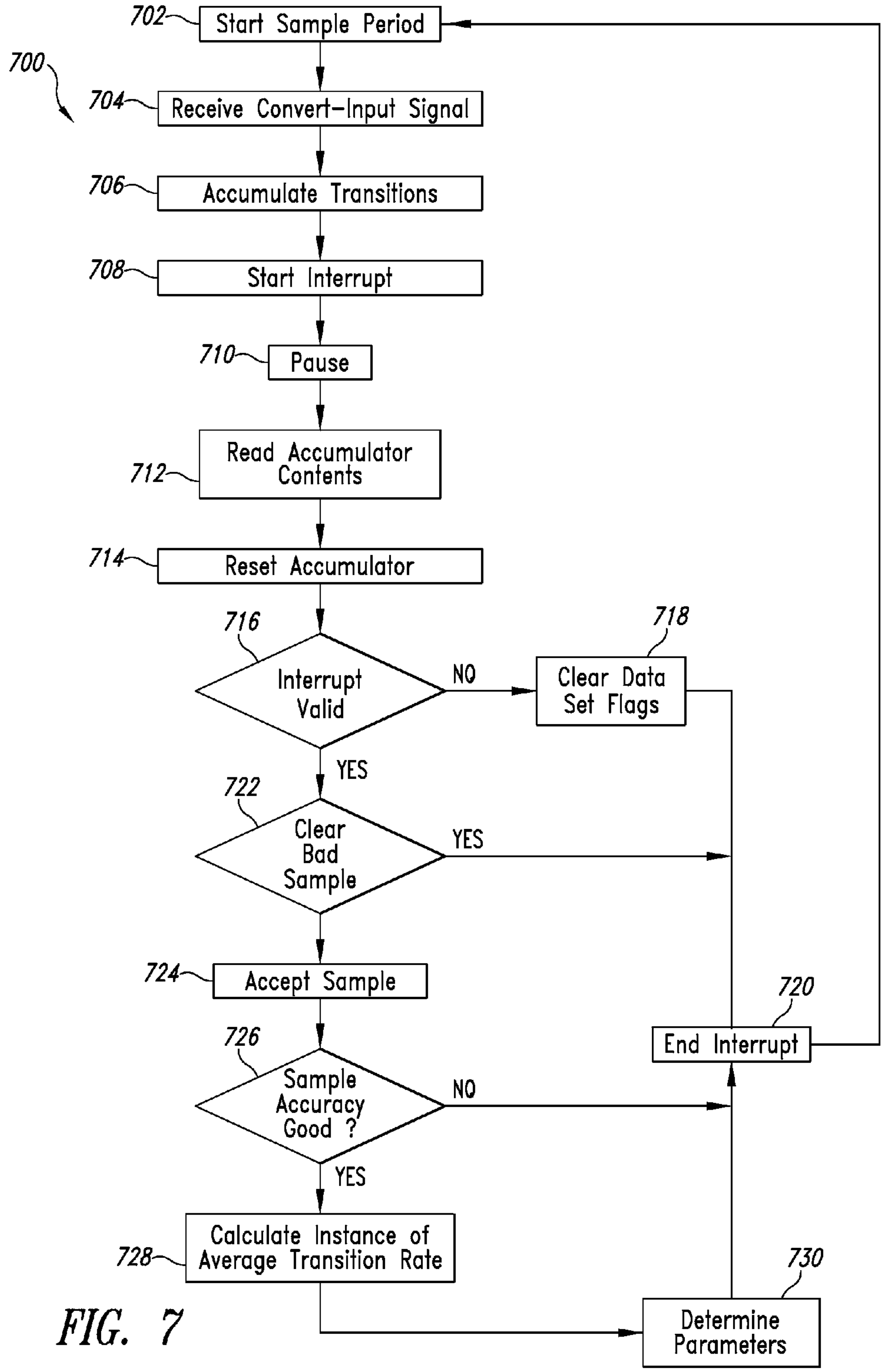
FIG. 7 is a flow diagram showing a process to adaptively determine a transition rate that is proportional to a quantized characteristic of an output according to one illustrated embodiment.

FIG. 7 shows an exemplary process 700 for adaptively measuring a transition rate that is proportional to a quantized characteristic of an output. The process is implemented by the ATRMS 12. The process 700 enables for a variable sample period. Typically, the sample period is increased when the number of accumulated state transitions drops too low to measure without unacceptable quantization error.

At 702, a sample period begins. Typically, the sample period begins at the start of a cycle of the PWM signal 62, i.e., immediately after the trailing edge 64. In some embodiments, the ATRMS 12 may provide the device 16 with device operation parameters at the beginning of the sample period and may provide the PWM signal 62 to the device 16 so that device output may be synchronized with the PWM signal 62. In some embodiments, the ATRMS 12 may provide device operation parameters 18 to the device 16 prior to the state of the PWM signal 62 changing. In some embodiments, the ATRMS 12 may provide the Sensor/Signal Converter 14 with processing data parameters 20 at the beginning of the sample period or prior to the state of the PWM signal 62 changing. The ATRMS 12 may cycle through various processing data parameters 20 so that the ATRMS 12 may sample different portions of the output 22 of the device. Cycling through various processing data parameters 20 may allow the ATRMS 12 to selectively control various aspects of the output 22. For example, the ATRMS 12 may cycle through processing data parameters 20 that cause the ISFC subsystem 42 to cycle through selecting input signals 44 from light sensors 40 that detect red light, green light, blue light, and white light, respectively. The ATRMS 12 may then regulate color and luminance of the light source 30 based upon sampling a respective converted-input signal for the detected red light, green light, blue light, and white light.

At 704, the ATRMS 12 receives the converted-input signal 24.

At 706, the accumulator 58 of the ATRMS 12 accumulates transitions between states of the converted-input signal 24. If there are no changes of state in the converted-input signal 24, then the value of the accumulator 58 remains zero. Otherwise, the value of the accumulator 58 is incremented for each transition in the converted-input signal 24.

At 708, an interrupt signal is provided by the timer subsystem 60 of the ATRMS 12. Typically, the interrupt signal is the trailing edge 64 of a cycle of the PWM signal 62.

At 710, the transition rate measurement subsystem 56 may pause or delay for a predetermined amount of time before reading the value of the accumulator. The duration of the delay is typically sufficient to allow the ISFC 42 to finish processing/quantizing the input signals 44 up to the interrupt signal and to allow the accumulator to increment if there is a transition in the converted-input signal 24 during the delay.

At 712, the transition rate measurement subsystem 56 reads the accumulator 58 to find the current accumulator value (Acc_Value).

At 714, the transition rate measurement subsystem 56 resets the accumulator 58 to zero.

At 716, the transition rate measurement subsystem 56 determines whether the interrupt signal was valid. Typically, the timing of the interrupt is checked to make sure that it occurred within a reasonable time frame. This may be done by comparing the contents of a PWM timer register with an expected value of the PWM timer register.

At 718, if the interrupt was invalid, the transition rate measurement subsystem 56 clears data such as a total accumulator value (Ttl_Acc=0), which represents the total number of accumulated transitions over at least one sample period, and may set flags such as a "bad interrupt" flag (BI=true). Other data that might be cleared, e.g., set to a predetermined value such as zero, such as a "sample count" (Smpl_Cnt) which represents the number of sample periods to average over. Then the process continues at 720, where the interrupt is ended. The process then returns to 702.

At 722, if the interrupt was valid, the transition rate measurement subsystem 56 determines whether to clear a bad sample. Typically, a bad sample occurs if an invalid interrupt had been previously detected and if current accumulator value (Acc_Value) read by the transition rate measurement subsystem 56 is zero. If the transition rate measurement subsystem 56 determines the current sample is a bad sample, then the process continues at 720, otherwise, the process continues at 724.

At 724, the transition rate measurement subsystem 56 accepts the current sample. In some embodiments, the transition rate measurement subsystem 56 may add the current accumulator value (Acc_Value) to a total accumulator value (Ttl_Acc=Ttl_Acc+Acc_Value) and may increment the sample count (Smpl_Cnt=Smpl_Cnt+1). The transition rate measurement subsystem 56 may also reset flags such as the bad interrupt" flag (BI=false).

At 726, the transition rate measurement subsystem 56 determines whether the current data will provide sufficient sample accuracy. Sample accuracy may be based upon, among other things, the total accumulator value (Ttl_Acc) and/or the sample count (Smpl_Cnt). If the total accumulator value is less than a target accumulator value, then the accuracy of the sample may be suspect. If the transition rate measurement subsystem 56 determines that the current data will not provide sufficient sample accuracy, the process continues at 720 and more data (converted-input signal 24) is sampled. On the other hand, if the transition rate measurement subsystem 56 determines that the current data will provide sufficient sample accuracy, the process continues at 728. In some embodiments, the transition rate measurement subsystem 56 may determine whether the current data will provide sample accuracy based upon, among other things, the sample period and/or the total accumulator value and/or a threshold for the sample count and/or one or more thresholds for the total accumulator value. If the sample period is below a given threshold, then the transition rate measurement subsystem 56 may apply a lower target accumulator value. In some embodiments, the transition rate measurement system 56 may be configured to selectively choose between accuracy and sample speed in various situations. For example, if the transition rate of the converted-input signal 24 is low during a sample period, then the value of the accumulator in the sample period will be small. In such a case, the transition rate measurement system 56 may select sample speed over accuracy by applying a low target accumulation value and a low sample count threshold value. At higher frequencies, the transition rate measurement system 56 may select accuracy over sample speed by applying a high target accumulation value.

At 728, the transition rate measurement subsystem 56 calculates an instance of average transition rate for the converted-input signal 24 over the effective sample period. The effective sample period is the product of the period of the PWM signal 62 multiplied by the number of samples counted (Smpl_Cnt). The instance of average transition rate ($Tr_{avg}$), for the sampled period of the converted-input signal can be given as: $Tr_{avg}=(Ttl\_Acc/(T_{sample}\times Smpl\_Cnt)$, where $T_{sample}$ is the period over which data was accumulated during the PWM signal 62. Instead of measuring the average transition rate, the average transition frequency could also be measured, where frequency is being used in the conventional sense of cycles/unit time. Hence, the average transition frequency will be one-half the average transition rate because one transition cycle requires two transitions. It should be noted that there are multiple definitions for the sample period ($T_{sample}$), such as, the duration of the PWM signal 62 or the duration of the high state of the PWM signal 62 ($\tau_1$ see FIG. 5A). Consequently, the value of an instance of average transition rate ($Tr_{avg}$) will depend upon which definition of the sample period ($T_{sample}$) is used. For the purposes described herein, the value of an instance of average transition rate ($Tr_{avg}$) is not critical for determining feedback control to the device 16, so long as the definition of the sample period is consistently applied.

At 730, the control system 54 determines parameters based upon at least the instance of average transition rate. Among other things, the control system 54 may determine a new PWM frequency, and/or new device operation parameters such as amplitude/magnitude output indicator. The control system 54 may then provide the new device operation parameters 18 to the device 16, which will then operate in accordance with the new device operation parameters 18.

In one embodiment, the process 700 begins at 702 on the trailing edge 64 of a cycle of the PWM signal 62 and completes 720 prior to the rising edge 65 of the subsequent cycle of the PWM signal 62. In such an embodiment, the ATRMS 12 may regulate the output 22 of the device 16 with each instance of average transition rate.

Figure 8:
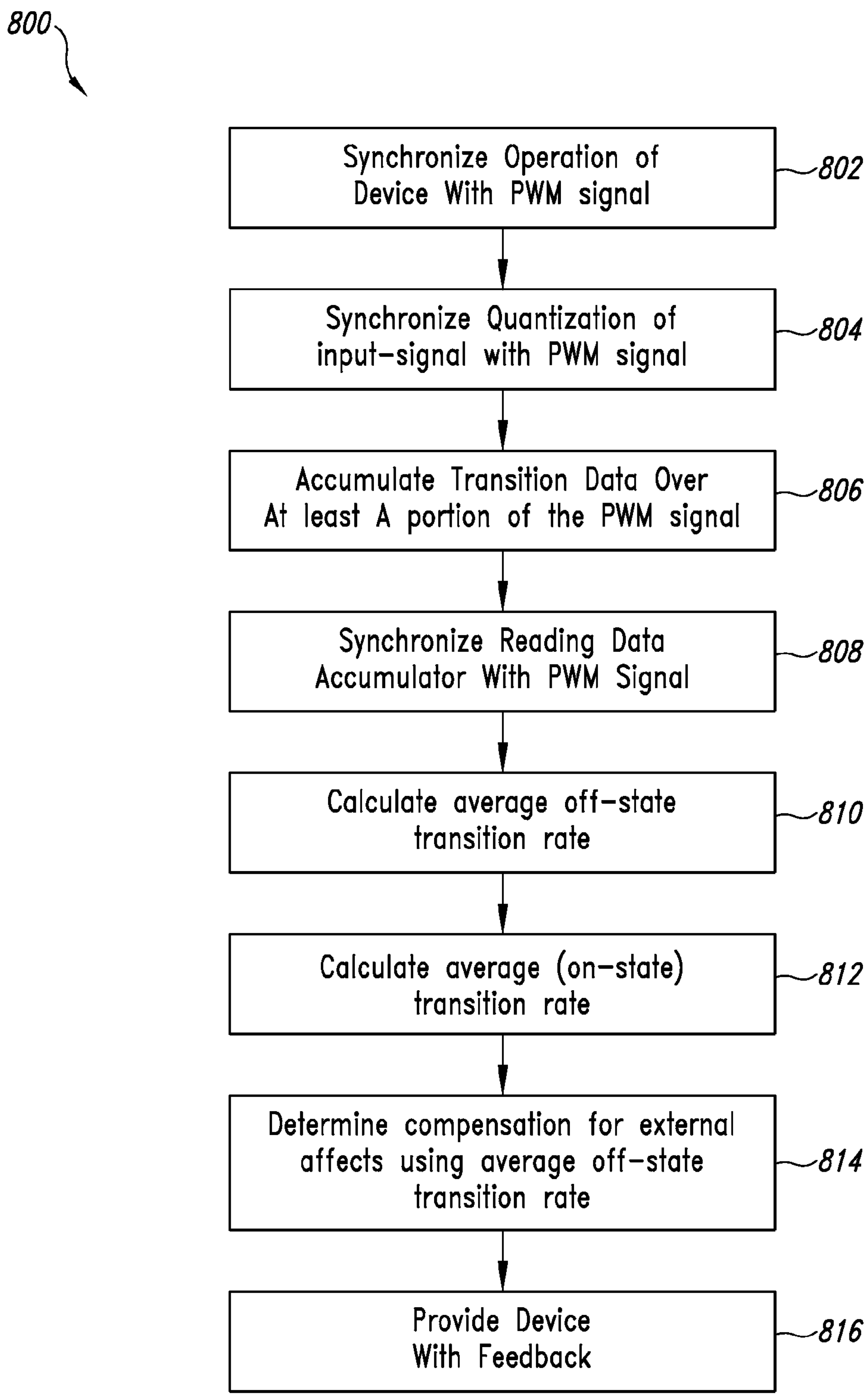
FIG. 8 is a flow diagram showing a process to regulate an output from a device according to one illustrated embodiment.

FIG. 8 shows a process 800 for regulating an output from a device according to one illustrated embodiment.

At 802, the device 16 is synchronized with a PWM signal 62. The device 16 has two states, OUTPUT_OFF and OUTPUT_ON, which are synchronized with the low and high states of the PWM signal 62, respectively. When the device 16 is in the OUTPUT_OFF state, the device 16 does not provide or emit the output 22, and when the device 16 is in the OUTPUT_ON state, the device provides or emits the output 22. In some embodiments, the OUTPUT_OFF and OUTPUT_ON may be synchronized with the high and low states of the PWM signal 62, respectively.

At 806, which may be optional in some embodiments, the operation of the input-signal quantizer 50 may be synchronized by the PWM signal 62. As a non-limiting example, the input-signal quantizer 50 may be synchronized to quantize a characteristic of the input-signals 44 only during the high state of the PWM signal 62, which will prevent the input-signal quantizer 50 from increasing the value of the input-signal quanta during the low state of the PWM signal 62, which corresponds to when the device 16 is in the OUTPUT_OFF state and is not emitting light 22(2). Consequently, the ISFC subsystem 42 will not change state during the low state of the PWM signal 62. In addition, preventing the input-signal quantizer 50 from increasing the value of the input-signal quanta during the low state of the PWM signal 62, which is the OUTPUT_OFF state of the device 16, improves the reliability of at least some statistical quantities of the converted-input signal 24. For example, if the value of the input-signal quanta increased when the device 16 was in the OUTPUT_OFF state, but the increase was not enough for the value of the input-signal quanta to reach the input-signal quanta threshold value ($I_{TH}$), then the input-signal quanta will reach the input-signal quanta threshold value ($I_{TH}$) earlier than it otherwise would have if the increase in the input-signal quanta had not occurred. Consequently, the ISFC subsystem 42(2) will change state earlier than it should have.

At 808, the accumulator 58 accumulates data over at least a portion of the duration of the current cycle of PWM signal 62. In some embodiments, the accumulator 58 may accumulate data, e.g., count the number of state transitions in the converted-input signal 24, over the entire duration of a cycle of the PWM signal 62. In other embodiments, the accumulator 58 may be synchronized with the PWM signal 62 to accumulate data during one of the states of the cycle of the PWM signal 62 such as the high state of the cycle of the PWM signal 62. In some embodiments, it may be desirable to synchronize the accumulator 58 to accumulate state transitions only during the high state of the cycle of PWM signal 62 (when the device 16 is in the OUTPUT_ON state) so that state transitions that occur during the low state of the cycle of the PWM signal 62 (when the device is in the OUTPUT_OFF state) may be ignored.

At 810, the transition rate measurement subsystem 56 is synchronized to read the accumulator 58 with the PWM signal 62. In some embodiments, the transition rate measurement subsystem 56 reads the accumulator 58 on trailing edge 64 of the current cycle of the PWM signal 62. In other embodiments, the transition rate measurement subsystem 56 is synchronized by the trailing edge 64, but the transition rate measurement subsystem 56 delays reading the accumulator for a predetermined period of time relative to the trailing edge 64 of the current cycle of the PWM signal 62. The delay period is of sufficient duration to allow the accumulator 58 to count any transitions in the converted-input signal 24 due to output 22 up to the trailing edge 64 of the current cycle of the PWM signal 62 received by the device 16. In some embodiments, the transition rate measurement subsystem 56 is synchronized to read the accumulator 58 a first time on, or within a predetermined delay period from, the rising edge 65 of the current cycle of the PWM signal 62 and a second time on, or within a predetermined delay period from, the trailing edge 64 of the current cycle of the PWM signal 62.

At 812, which may be optional in some embodiments, the transition rate measurement subsystem 56 calculates an instance of average off-state transition rate ($Tr_{off\_avg}$). The instance of average off-state transition rate ($Tr_{off\_avg}$) may be determined by the number of transitions counted during one or more low states of the PWM signal 62 divided by a sample period, e.g., the time over which the number of transitions were counted. The instance of average off-state transition rate ($Tr_{off\_avg}$) gives an indication of external contributions to the signals 44. For example, referring to FIGS. 2B, 3B, and 4, consider the situation of the light processing unit 38 receiving light that consists of light 22(2), i.e., light emitted from the LEDs 36 of the light source 30, and external light, i.e., light from any source other than the LEDs 36. In this situation, the light sensors 40 detect only the external light when the light source 30 is in the OUTPUT_OFF state (corresponding to the low state of the cycle of the PWM signal 62), and when the light source 30 is in the OUTPUT_ON state (corresponding to the high state of the cycle of the PWM signal 62), the light sensors 40 detect the light 22(2) and the external light. Thus, during the low state of the cycle of the PWM signal 62, the input signals 44 are caused by the external light, and during the high state of the cycle of the PWM signal, the input signals are caused by the combined light 22(2) and the external light. If during the low state of the cycle of the PWM signal 62, the input-signal quantizer 50 did not quantize a characteristic of the input signal 44 and/or the accumulator 58 did not accumulate data, then block 812 might not be performed in some embodiments.

At 812, transition rate measurement subsystem 56 calculates an instance of average transition rate ($Tr_{avg}$) and/or an instance of average on-state transition rate ($Tr_{on\_avg}$). The instance of average on-state transition rate ($Tr_{on\_avg}$) may be determined by the number of transitions counted during one or more high states of the PWM signal 62 divided by the sample period, i.e., the time over which the number of transitions were counted. The instance of average transition rate ($Tr_{avg}$) may be determined by the number of transitions counted during one or more of the cycles of the PWM signals 62 divided by the sample period, i.e., the time over which the number of transitions were counted.

As previously described, there are multiple definitions for a sample period ($T_{sample}$). For example, sample periods for the instance of average off-state transition rate ($Tr_{off\_avg}$) may include the duration of the low state of the cycle of the PWM signal 62, e.g., $T_1$-$\tau_1$ (see FIG. 5A) or the duration of the cycle of the PWM signal 62 e.g., $T_1$ (see FIG. 5A). Similarly, sample periods for the instance of average on-state transition rate ($Tr_{on\_avg}$) or the instance of average transition rate ($Tr_{avg}$) may include the duration of the high state of the cycle of the PWM signal 62, e.g., $\tau_1$ (see FIG. 5A) or the duration of the cycle of the PWM signal 62 e.g., $T_1$ (see FIG. 5A). For the purposes described herein, the respective values of an instance of average transition rate ($Tr_{avg}$), an instance of average on-state transition rate ($Tr_{on\_avg}$), and an instance of average off-state transition rate ($Tr_{off\_avg}$) are not critical for determining feedback control to the device 16, so long as the respective averages are consistently calculated.

At 814, the control subsystem 54 uses the instance of average off-state transition rate ($Tr_{off-avg}$) to determine how to compensate for the affects of external sources that contribute to the input-signals 44.

At 816, the control subsystem 54 provides the device 16 with feedback such as device operation parameters 18. The feedback and/or the device operation parameters 18 may be determined using at least the instance of average off-state transition rate ($Tr_{off-avg}$) in conjunction with at least one of the instance of average transition rate ($Tr_{avg}$) or the instance of average on-state transition rate ($Tr_{on-avg}$). In some embodiments, the feedback and/or the device operation parameters 18 may be determined using at least the instance of average transition rate ($Tr_{avg}$) and/or the instance of average on-state transition rate ($Tr_{on-avg}$).

Figure 9:
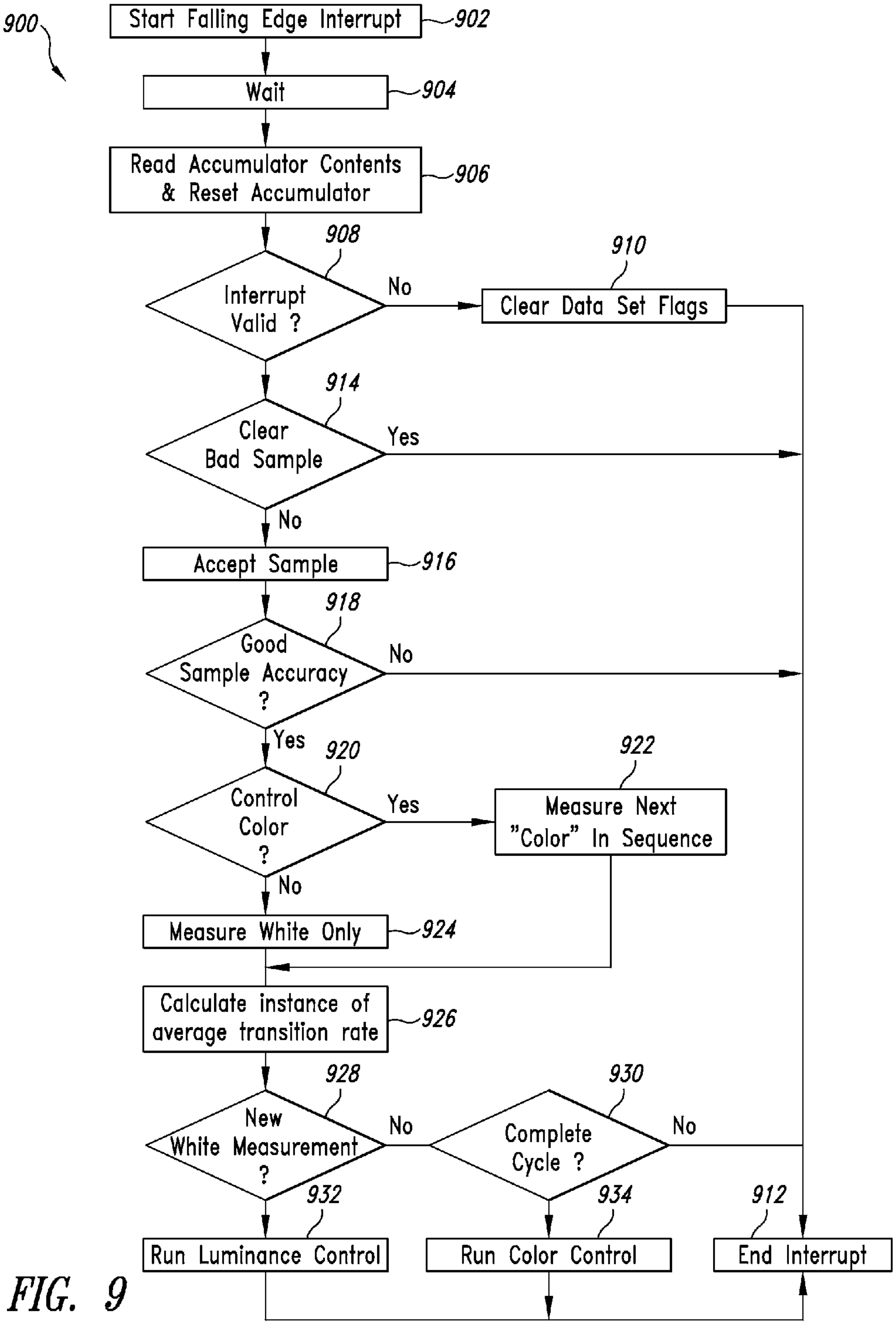
FIG. 9 is a flow diagram showing a process to regulate luminance and color in light emitted from a device according to one illustrated embodiment.

FIG. 9 shows an exemplary process 900 for regulating the light source 30 including regulating color and luminance of the emitted light 22(2). The process 900 is implemented in the control subsystem 54. The control subsystem 54 may be running multiple other processes some of which may be running in the foreground and others of which may be running in the background. In the following process, the complete sample cycle of light 22(2) would be interleaving the sampling of white light in light 22(2) with the sampling of colors in the light 22(2). For example, a complete sample cycle may be sampling in the following order: white light, red light, white light, green light, white light, blue light. With a 160 Hz sample rate and interleaved sampling a complete round of color samples takes 6/160 Hz=37.5 ms. For the white (no color filter) samples interleaved with color samples the sample rate is 2/160 Hz=12.5 ms. The white (no color filter) luminance may be sampled faster than the colors as luminance control is more likely to need fast transient correction than color in a backlighting application.

Ambient light compensation can be useful in high ambient light situations such as when a display of an AMLCD is directly illuminated by the sun. This becomes especially important for direct view LED backlighting, as the light processing subsystem 38 may not point directly at the light source, but rather picking up light scattered back by the optics stack behind an AMLCD. As such, the gain of the light processing subsystem 38 may be quite high and ambient light can have a significant effect on measured light.

A rough measurement of ambient light can be made by measuring the transition rate of the light processing subsystem 38 during the off period of the light source 30 PWM cycle. This requires an interrupt to be generated on the rising edge of the backlight PWM cycle. The number of state transitions counted by the accumulator with the backlight off can then be divided by the PWM off time to give a measure of ambient light. This works when the light processing subsystem 38 is configured for white (no color filter) luminance.

The measured transition rate of ambient light can then be subtracted from the measured transition rate of backlight luminance to give a relatively accurate backlight luminance reading in high ambient lighting conditions.

As the measurement is made over a short time period there is a significant amount of quantization noise in the measurement at low transition rates. Low transition rate noise can be excluded from the reading by reducing the result by a constant such as 1000 Hz and limiting to 0. Thus the ambient light compensation only has affect at high ambient conditions where the transition rate is higher than 1000 transitions/second.

To provide ambient light sensing at high backlight drive levels the maximum backlight PWM duty cycle may be to limited to ~90% to allow a window of time for the light processing subsystem 38 to measure the ambient light.

At 902, an interrupt is initiated. The interrupt allows the control subsystem 54 implement blocks 904-912 of the process 900 in the foreground. The interrupt is initiated at the falling edge 64 of the cycle of the pulse width modulation signal 62.

At 904, the control subsystem 54 waits a predetermined amount of time. The delay allows the accumulator 58 count any state transitions that occurred up to the trailing edge 64 of the current cycle of the pulse width modulation signal 62. For example, the light processing subsystem 38 may have a lag of approximately 5 microseconds, which means that the accumulator 58 must not be read until the light processing subsystem 38 has had a chance to finish reporting all the light measured from the previous cycle of the PWM signal 62.

At 906, the transition rate measurement subsystem 56 reads the accumulator 58 to find the current accumulator value (Acc_Value) and resets the accumulator 58 to zero.

At 908, the transition rate measurement subsystem 56 determines whether the interrupt signal was valid. Typically, the timing of the interrupt is checked to make sure that it occurred within a reasonable time frame. It is possible that the interrupt could be delayed by other processes competing for resources of the control subsystem 54. In the event that the interrupt occurs a little too late the reading will remain accurate as the device 16 remains off until the start of the rising edge 65 of the next cycle of the PWM signal 62. However, if the interrupt is delayed too long then the data will be corrupt. This can be detected by looking at the value in the PWM timer register and comparing it with the expected value. If it is corrupt then the sample process should not be resumed until another state transition has been received to eliminate timing errors.

At 910, if the interrupt was invalid, the transition rate measurement subsystem 56 clears data such as a total accumulator value (Ttl_Acc=0), which represents the total number of accumulated transitions over at least one sample period, and may set flags such as a "bad interrupt" flag (BI=true). Other data that might be cleared, e.g., set to a predetermined value such as zero, such as a "sample count" (Smpl_Cnt), which represents the number of sample periods to average over. In some embodiments, the transition rate measurement subsystem 56 may keep a total "color" accumulator value for each color (including white) in the sample cycle, e.g., a total "white" accumulator value, a total "red" accumulator value, a total "blue" accumulator value, and a total "green" accumulator value and may also keep "color" (e.g., white, red, blue, green) sample counts. If the transition rate measurement subsystem 56 keeps total "color" accumulator values and/or "color" sample counts, then they may be cleared or set to zero. Then the process continues at 912, where the interrupt is ended.

At 914, if the interrupt was valid, the transition rate measurement subsystem 56 determines whether to clear a bad sample. Typically, a bad sample occurs if an invalid interrupt had been previously detected and if current accumulator value (Acc_Value) read by the transition rate measurement subsystem 56 is zero. If the transition rate measurement subsystem 56 determines the current sample is a bad sample, then the process continues at 912, otherwise, the process continues at 916.

At 916, the transition rate measurement subsystem 56 accepts the current sample. In some embodiments, the transition rate measurement subsystem 56 may add the current accumulator value (Acc_Value) to the total accumulator value (Ttl_Acc=Ttl_Acc+Acc_Value) and may increment the sample count (Smpl_Cnt=Smpl_Cnt+1). In some embodiments, the transition rate measurement subsystem 56 may add the current accumulator value (Acc_Value) to one of the total "color" accumulator values and/or may increment one of the "color" sample counts. The current accumulator value (Acc_Value) was accumulated while the light processor subsystem 38 sampled light for one of the colors (including white) of the sample cycle. The transition rate measurement subsystem 56 knows which color was just sampled, and adds the current accumulator value to the appropriate total "color" accumulator value and increments the "color" sample count. The transition rate measurement subsystem 56 may also reset flags such as the bad interrupt" flag (BI=false).

At 918, the transition rate measurement subsystem 56 determines whether the current data will provide sample accuracy. Sample accuracy may be based upon, among other things, the total accumulator value (Ttl_Acc), or based on one or more of the total "color" accumulator values and/or the sample count (Smpl_Cnt) and/or "color" sample counts. If the total accumulator value (or total "color" accumulator count) is less than a target accumulator value, then the accuracy of the sample may be suspect. If the transition rate measurement subsystem 56 determines that the current data will not provide sufficient sample accuracy, the process continues at 912 and more data (converted-input signal 24) is sampled. On the other hand, if the transition rate measurement subsystem 56 determines that the current data will provide sufficient sample accuracy, the process continues at 920. In some embodiments, the transition rate measurement subsystem 56 may determine whether the current data will provide sample accuracy based upon, among other things, the sample period and/or the total accumulator value and/or a threshold for the sample count and/or one or more thresholds for the total accumulator value. If the sample period is below a given threshold, then the transition rate measurement subsystem 56 may apply a lower a target accumulator value. In some embodiments, the transition rate measurement system 56 may be configured to selectively choose between accuracy and sample speed in various situations. For example, if the transition rate of the converted-input signal 24 is low during a sample period, then the value of the accumulator in the sample period will be small. In such a case, the transition rate measurement system 56 may select sample speed over accuracy by applying a low target accumulation value and a low sample count threshold value. At higher transitions rates, the transition rate measurement system 56 may select accuracy over sample speed by applying a high target accumulation value.

At 920, the transition rate measurement subsystem 56 determines whether to control color in the light 22(2) emitted from the light source 30. This determination may done so as to help insure accurate luminance control. The determination may be made based at least upon prior statistics such as a prior instance of average transition rate ($Tr_{avg}$) or a prior instance of average on-state transition rate ($Tr_{on-avg}$) for a white light sample and a color threshold value. A white light sample occurs when the ISFC 42(2) quantizes a characteristic of the input-signals 44 from the "white light" light sensors 46*d*. If the prior instance of average transition rate ($Tr_{avg}$) and/or the prior instance of average on-state transition rate ($Tr_{on-avg}$) is below the color threshold value, then color sampling would slow luminance control and introduce noise into the color control loop. If the prior instance of average transition rate ($Tr_{avg}$) and/or the prior instance of average on-state transition rate ($Tr_{on-avg}$) is below the color threshold value, then color sampling is by passed and the process continues at block 924, otherwise the process continues at 922.

At 922, the light processing unit 38 is set to sample the next "light" in the sample cycle, e.g., white light, red light, white light, green light, white light, blue light, over the next cycle of the pulse width modulation signal 62. The control subsystem 54 provides the light processing unit 38 with data processing parameters specifying which color of light (including white light) to sample, and the light processing unit 38 selects the appropriate light sensors 40.

At 924, the light processing unit 38 is set to sample "white" light over the next cycle of the pulse width modulation signal 62. The control subsystem 54 provides the light processing unit 38 with data processing parameters specifying white light to sample, and the light processing unit 38 selects the "white" light sensors 40, i.e., photodiodes 46*d*.

At 926, the control subsystem 54 calculates the instance of average transition rate based at least upon the total accumulator value (Ttl_Acc=Ttl_Acc+Acc_Value) and the sample period, which may be the sample count (Smpl_Cnt) multiplied by the duration of the PWM signal 62 and/or the duration of the high state of the PWM signal 62. In some embodiments, the control subsystem 54 may calculate an instance of average "color" transition rate based at least upon one of the total "color" accumulator values and the sample period over which the total "color" accumulator value was accumulated.

At 928, the control subsystem 54 determines whether "white" light was sampled by the light processing unit 38 during the last sample period. If so, the process continues at 932, and if not, the process continues at 930.

At 930, the control subsystem 54 determines whether a sample cycle has been completed, e.g., light processing unit 38 has sampled white, red, white, green, white, and blue light. If not, the process continues at 912. Otherwise, the process continues at 934.

At 934, the control subsystem 54 implements color control logic. The control subsystem 54 may determine "color" luminances based at least upon instances average transition rates or instances of average "color" transition rates. The control subsystem 54 may compare the "color" luminances with calibrated color ratio target. Based at least upon the comparison, the control subsystem 54 may then provide feedback to the light source 30 to regulate the colors emitted from the light source 30. The feedback may be included with the device operation parameters 18. At 934, accumulated data such as, but not limited to, total "color" accumulator values, total accumulator value, sample count, "color" sample count, etc. may be reset and flags may be reset.

If the determination at block 928 was that "white" light was sampled by the light processing unit 38 during the last sample period, then the process continues at 932. At 932, the control subsystem 54 implements luminance control logic. The control subsystem 54 may determine the amount of ambient light based at least upon an instance of average transition rate for transitions that occurred during the low state of the PWM signal 62. The control subsystem 54 may then compensate for the ambient light by lowering the value of the current instance of average "white" transition rate, and calculating feedback based at least upon the lowered value of the current instance of average "white" transition rate. The control subsystem 54 may provide the feedback with the device operation parameters 18.

In process 900, color sampling can be suspended when the transition rate from the light processing subsystem 38 drops to the point where multiple sample periods are required. This helps maintain luminance transient response time by devoting more photo sensor time to measuring white (no color filter) luminance. Also the relative error of the transition rate measurement tends to increase at low transition rates which causes undesirable noise in the color control.

Furthermore, as transition rate drops below the accumulator sample frequency a transition is required immediately before the first sample period to maintain accuracy. By only sampling the white (no color filter) channel a state transition from that channel is guaranteed to be received on the previous cycle. This automatically happens as the accumulator can only be reset and the frequency calculated on a cycle when a state transition is received.

With the color sampling suspended the color control algorithm is no longer run. This results in the output of the color controller freezing until the frequency from the photo sensor increases and the color control is resumed.

An alternative to suspending color control at low luminance is to sample the color quickly with high quantization error and then apply a suitably weighted low pass filter to reduce the error. The control gain for the color control loop would have to be reduced accordingly to maintain stability.

Figure 10:
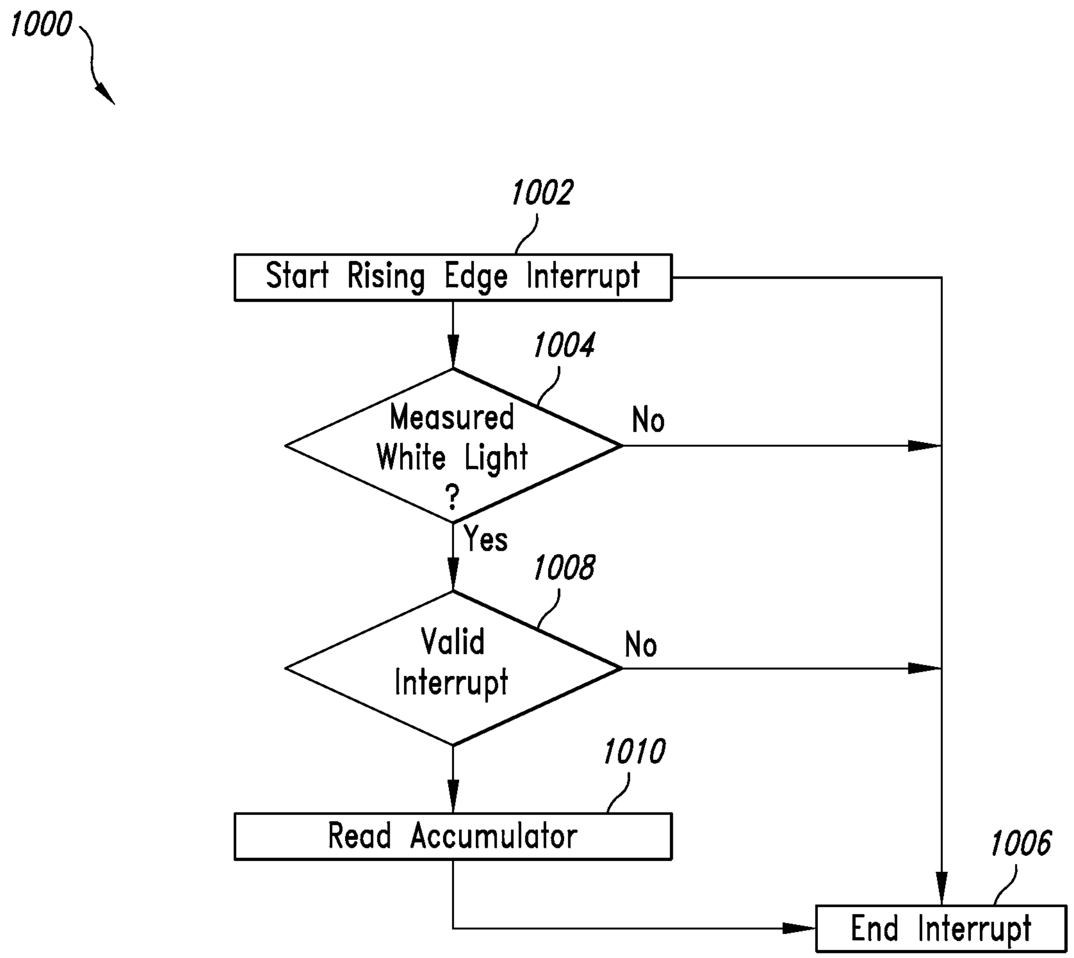
FIG. 10 is a flow diagram showing a process to measure the effect of non-synchronized according to one illustrated embodiment.

FIG. 10 shows an exemplary process 1000 for measuring the effects from non-synchronized sources. The process 1000 is implemented in the control subsystem 54. The control subsystem 54 may be running multiple other processes some of which may be running in the foreground and others of which may be running in the background.

At 1002, an interrupt is initiated. The interrupt allows the control subsystem 54 implement blocks 1004-1010 of the process 1000 in the foreground. The interrupt is initiated at the rising edge 65 of the current cycle of the pulse width modulation signal 62.

At 1004, the transition measurement subsystem 56 determines whether white light will be sampled during at least a portion of the duration of the current cycle of the PWM signal 62. If not, the process continues at 1006. At 1006, the interrupt ends.

On the other hand, if the determination is that white light will not be sampled during at least a portion of the duration of the current cycle of the PWM signal 62, the process continues at 1008. At 1008, the transition measurement subsystem 56 determines whether the current interrupt is a valid interrupt. If not, the process continues at 1006, and if so, the process continues at 1010.

At 1010, the transition rate measurement subsystem 56 reads the accumulator 58 to find the current accumulator value (Acc_Value_Rising). In some embodiments, the transition rate measurement subsystem 56 may reset the accumulator. The current value of the accumulator corresponds to the number of state transitions during the low state of the current cycle of the PWM signal 62, which corresponds to the amount of ambient light detected by the light processing subsystem 38 during the low state of the current cycle of the PWM signal 62. Based upon at least the current accumulator value (Acc_Value_Rising) and/or a total accumulator value accumulated over a respective low state of one or more cycles of the PWM signals and a sample period, the transition rate measurement subsystem 56 may determine an average transition rate during the low state of PWM signal. The average transition rate during the low state of the PWM signal may related to the amount of ambient light and the control subsystem 54 may determine feedback to compensate for the ambient light.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet, are incorporated herein by reference, in their entirety. Aspects of the embodiments can be modified, if necessary to employ concepts of the various patents, applications and publications to provide yet further embodiments.

The above description of shown embodiments, including what is described in the Abstract, is not intended to be exhaustive or to limit the embodiments to the precise forms disclosed. Although specific embodiments of and examples are described herein for illustrative purposes, various equivalent modifications can be made without departing from the spirit and scope of the disclosure, as will be recognized by those skilled in the relevant art.

For example, while specific embodiments were illustrated as having a light source and light processing unit, in other embodiments, the device 16 may emit an output that is different from light, and in that case, the Sensor/Signal Converter 14 may include an appropriate sensor for detecting the emitted output. As non-limiting examples, the device 16 may emit acoustic energy, and in that case, the Sensor/Signal Converter 14 may include acoustic sensors; or the device 16 may emit radiation, and in that case, the Sensor/Signal Converter 14 may include radiation detectors, etc.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

Furthermore, the foregoing detailed description has set forth various embodiments of the devices and/or processes via the use of block diagrams, schematics, and examples. Insofar as such block diagrams, schematics, and examples contain one or more functions and/or operations, it will be understood by those skilled in the art that each function and/or operation within such block diagrams, flowcharts, or examples can be implemented, individually and/or collectively, by a wide range of hardware, software, firmware, or virtually any combination thereof. In one embodiment, the present subject matter may be implemented via Application Specific Integrated Circuits (ASICs). However, those skilled in the art will recognize that the embodiments disclosed herein, in whole or in part, can be equivalently implemented in standard integrated circuits, as one or more computer programs running on one or more computers (e.g., as one or more programs running on one or more computer systems), as one or more programs running on one or more controllers (e.g., microcontrollers) as one or more programs running on one or more processors (e.g., microprocessors), as firmware, or as virtually any combination thereof, and that designing the circuitry and/or writing the code for the software and or firmware would be well within the skill of one of ordinary skill in the art in light of this disclosure.

In addition, those skilled in the art will appreciate that the mechanisms of taught herein are capable of being distributed as a program product in a variety of forms, and that an illustrative embodiment applies equally regardless of the particular type of signal bearing media used to actually carry out the distribution. Examples of signal bearing media include, but are not limited to, the following: recordable type media such as floppy disks, hard disk drives, CD ROMs, digital tape, and computer memory; and transmission type media such as digital and analog communication links using TDM or IP based communication links (e.g., packet links).

The invention claimed is:

1. An adaptive measurement system for measuring a transition rate associated with an output of a device in synchronous operation with a pulse width modulation signal, comprising:

an input signal-to-frequency converter subsystem that receives a first signal that is proportional to the output of the device and quantizes a characteristic of first signal, the input signal-to-frequency converter subsystem providing a second signal having multiple states and a transition rate that is proportional to a rate of quantization of the characteristic of the first signal;

an accumulator that receives the second signal and that accumulates a state transition count that is representative of a number of transitions between the multiple states in the second signal over a first sample period;

a transition rate measurement subsystem communicatively coupled to the accumulator and that reads the accumulator in synchronization with the pulse width modulation signal to find the state transition count and determines an instance of average transition rate for the second signal based at least upon the state transition count and the first sample period.

2. The adaptive measurement system of claim 1, further comprising:

a timer subsystem that is communicatively coupled to the transition rate measurement subsystem and to the device and that provides the pulse width modulation signal to the transition rate measurement subsystem and to the device.

3. The adaptive measurement system of claim 2 wherein the sample period ends at a trailing edge of a cycle of the pulse width modulation signal.

4. The adaptive measurement system of claim 3 wherein the cycle of the pulse width modulation signal has a duration that is approximately the same as the first sample period.

5. The adaptive measurement system of claim 3 wherein the pulse width modulation signal is in a first state for a first time period and in a second state for a second time period, and wherein the first sample period is approximately an integer multiple of the second time period.

6. The adaptive measurement system of claim 3 wherein the transition rate measurement subsystem waits a predetermined amount of time after a trailing edge of the cycle of the pulse modulation signal to read the accumulator.

7. The adaptive measurement system of claim 1 wherein the input signal-to-frequency converter subsystem measures electrical current in the first signal and quantizes the amount of electrical current received at the input signal-to-frequency converter subsystem.

8. The adaptive measurement system of claim 1 wherein whenever the quantized characteristic of the first signal reaches a threshold value, the second signal switches between a first state of the multiple states and a second state of the multiple states.

9. The adaptive measurement system of claim 1 wherein the transition rate measurement subsystem determines whether the state transition count accumulated during the first sample period is not less than a predetermined accumulated count threshold, and if the state transition count is less than the predetermined accumulated count threshold, then the transition rate measurement subsystem accumulates data over at least a second sample period and determines the instance of average transition rate based at least upon data accumulated during the first sample period and the at least second sample period.

10. The adaptive measurement system of claim 1, further comprising:

a control subsystem communicatively coupled to the transition rate measurement subsystem that receives the instance of average transition rate for the second signal and provides the device with feedback control based at least upon the instance of average transition rate.

11. The adaptive measurement system of claim 10 wherein the transition rate measurement subsystem is synchronized by a rising edge of a cycle of the pulse width modulation signal to read the accumulator to find a second state transition count and synchronized by a trailing edge of the cycle of the pulse width modulation signal to read the accumulator to find the first state transition count, wherein the transition rate measurement subsystem determines an instance of average off-state transition rate for the second signal based at least upon the second state transition count, and wherein the feedback control provided to the device is based at least upon the instance of average transition rate and the instance of average off-state transition rate to compensate for external affects on the device.

12. A method of regulating an output of a device, comprising:

quantizing a characteristic of an input signal;

receiving a converted-input signal having multiple states and a transition rate that is proportional to a rate of quantization of the characteristic of an input signal, the input signal being proportional to the output of the device;

switching the converted-input signal between a first state of the multiple states and a second state of the multiple states whenever the quantized characteristic of the input signal reaches a threshold value;

accumulating a state transition count that is representative of a number of transitions between the multiple states in the converted-input signal over a first sample period;

reading the accumulator at a time that is no earlier than the end of the first sample period to find the state transition count;

determining an instance of average transition rate for the converted-input signal based at least upon the state transition count and the first sample period; and providing the device with feedback control based at least upon the instance of average transition rate.

13. The method of claim 12, further comprising:

providing an interrupt signal at the end of the sample period, wherein the interrupt signal is provided prior to determining an instance of average transition rate.

14. The method of claim 13 wherein the interrupt signal is a trailing edge of a cycle of the pulse width modulation signal.

15. The method of claim 14 wherein the cycle of the pulse width modulation signal has a duration that is approximately the same as the first sample period.

16. The method of claim 14, further comprising:

synchronizing the device with the pulse width modulation signal.

17. The method of claim 14, further comprising:

waiting a predetermined amount of time after receiving the interrupt signal to read the accumulator.

18. The method of claim 13, further comprising:

resetting the accumulator after receiving the interrupt signal to read the accumulator.

19. The method of claim 12, further comprising:

determining whether the state transition count accumulated during the first sample period is not less than a predetermined accumulated count threshold, and if the state transition count is less than the predetermined accumulated count threshold, then further including:

accumulating data over at least a second sample period, and wherein determining an instance of average transition rate for the converted-input signal includes determining the instance of average transition rate based at least upon data accumulated during the first sample period and the at least second sample period.

20. An adaptive system for measuring an output of a device, comprising:

an input signal-to-frequency converter subsystem having an input-signal quantizer and a memory storing an input-signal quanta threshold value, the input-signal quantizer receives a first signal that is proportional to the output of the device and quantizes a characteristic of the first signal, the input signal-to-frequency converter subsystem switches a second signal having multiple states between a first state of the multiple states and a second state of the multiple states whenever the quantized characteristic of the input signal reaches the input-signal quanta threshold value and provides a second signal having multiple states and a transition rate that is proportional to a rate of quantization of the characteristic of the first signal; and a controller subsystem communicatively coupled to the input signal-to-frequency converter subsystem having a bit accumulator that receives the second signal and that accumulates a state transition count that is representative of a number of transitions between the multiple states in the second signal over a first sample period, the controller subsystem being configured to implement a logic for determining an instance of average transition rate for the second signal based at least upon the state transition count.

21. The adaptive system of claim 20, wherein the controller subsystem is further configured to implement logic for determining at least one device operation parameter for regulating the output of the device and for providing the at least one device operation parameter.

22. The adaptive system of claim 20, wherein the controller subsystem is further configured to implement logic for reading the bit accumulator at a time that is no earlier than the end of the first sample period to find state transition count.

23. The adaptive system of claim 20, wherein the controller subsystem is further configured to implement logic for providing a train of cycles of a pulse width modulation signal to the device, each cycle of the pulse width modulation signal having a first state followed by a second state, wherein the device produces the output only during the respective second state of the cycles of the pulse width modulation signal, and wherein the controller subsystem is further configured to implement logic for determining at least one device operation parameter for regulating the output of the device and for providing the at least one device operation parameter.

24. The adaptive system of claim 23, wherein during the first state of a given cycle of the pulse width modulation signal, the controller subsystem provides the at least one device operation parameter for the device to implement during the second state of the given cycle of the pulse width modulation signal.

* * * * *